(12) United States Patent
Clevenger et al.

(10) Patent No.: US 10,460,985 B2
(45) Date of Patent: Oct. 29, 2019

(54) ENHANCEMENT OF ISO-VIA RELIABILITY

(71) Applicant: International Business Machines Corporation, Armonk, NY (US)

(72) Inventors: Lawrence A. Clevenger, Lagrangeville, NY (US); Baozhen Li, South Burlington, VT (US); Xiao H. Liu, Briarcliff Manor, NY (US); Kirk D. Peterson, Jericho, VT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 186 days.

(21) Appl. No.: 15/652,162

(22) Filed: Jul. 17, 2017

(65) Prior Publication Data

US 2017/0316970 A1    Nov. 2, 2017

Related U.S. Application Data

(62) Division of application No. 14/835,256, filed on Aug. 25, 2015, now Pat. No. 9,761,482, which is a division of application No. 14/201,893, filed on Mar. 9, 2014, now abandoned.

(51) Int. Cl.
*H01L 21/768* (2006.01)
*H01L 23/522* (2006.01)
*H01L 23/532* (2006.01)

(52) U.S. Cl.
CPC .. *H01L 21/76831* (2013.01); *H01L 21/76802* (2013.01); *H01L 21/76805* (2013.01); *H01L 21/76829* (2013.01); *H01L 21/76832* (2013.01); *H01L 21/76834* (2013.01); *H01L 23/5226* (2013.01); *H01L 23/5329* (2013.01); *H01L 23/53295* (2013.01); *H01L 23/53238* (2013.01); *H01L 2924/0002* (2013.01)

(58) Field of Classification Search
CPC ......... H01L 21/76829; H01L 21/76831; H01L 21/76832; H01L 21/76834
See application file for complete search history.

(56) References Cited

U.S. PATENT DOCUMENTS

2008/0099918 A1\* 5/2008 Streck ................ H01L 21/3105
257/751

\* cited by examiner

*Primary Examiner* — Jesse Y Miyoshi
(74) *Attorney, Agent, or Firm* — Law Offices of Ira D. Blecker, P.C.

(57) ABSTRACT

A semiconductor structure and a process for forming a semiconductor structure. There is a back end of the line wiring layer which includes a wiring line, a cap layer and an ILD layer. A metal-filled via extends through the ILD layer to make contact with the wiring line. There is a reliability enhancement material in the cap layer. The reliability enhancement material surrounds the metal-filled via only in the cap layer to make a bottom of the metal-filled via that contacts the wiring line be under compressive stress, wherein the compressive reliability enhancement material has different physical properties than the cap layer. The reliability enhancement material may be compressive as deposited or may be made compressive after deposition.

20 Claims, 14 Drawing Sheets

ENHANCEMENT OF ISO-VIA RELIABILITY

BACKGROUND

The exemplary embodiments relate to enhancement of a via's reliability and, more particularly, relate to a structure and method of enhancing the reliability of vias by making the bottom of the vias be under compressive stress.

In a semiconductor structure, vias may be the weakest link for interconnect reliability. In the latest semiconductor technology, vias are smaller and so are more susceptible to voids and opens. Under the ground rules for the latest semiconductor technology, there may not be room for redundant vias so there may be only one via, an "iso-via", that provides the connection between wiring levels. Due to the lack of redundancy, any iso-via failure can cause a circuit, or even the entire semiconductor chip, to fail.

BRIEF SUMMARY

The various advantages and purposes of the exemplary embodiments as described above and hereafter are achieved by providing, according to an aspect of the exemplary embodiments, a semiconductor structure that includes a semiconductor base comprising a plurality of semiconductor devices and a back end of the line wiring layer. The back end of the line includes a wiring line; a cap layer on the wiring line; a reliability enhancement material within the cap layer and on the wiring line; an interlayer dielectric (ILD) layer on the cap layer and the reliability enhancement material; and a via that extends through the ILD and the reliability enhancement material to communicate with the wiring line; and a metal filling the via and in contact with the wiring line. Wherein the reliability enhancement material surrounds the metal-filled via only in the cap layer to make a bottom of the metal-filled via that contacts the wiring line be under compressive stress, wherein the compressive reliability enhancement material has different physical properties than the cap layer.

According to another aspect of the invention, there is provided a process of making a semiconductor structure including comprising: forming a wiring line; forming a cap layer on the wiring line; forming a reliability enhancement material within the cap layer and on the wiring line; forming an interlayer dielectric (ILD) layer on the cap layer; forming a via opening through the ILD layer and reliability enhancement material to expose a surface of the wiring line; and filling the via opening with a metal to form a metal-filled via in contact with the wiring line; wherein the reliability enhancement material surrounding the metal-filled via only in the cap layer to make a bottom of the metal-filled via that contacts the wiring line be under compressive stress, wherein the reliability enhancement material has different physical properties than the cap layer.

According to a further aspect of the exemplary embodiments, there is provided a process of making a semiconductor structure including: forming a wiring line; forming a cap layer on the wiring line; forming an interlayer dielectric (ILD) layer on the cap layer; forming a via opening through the ILD layer to expose a surface of the wiring line; etching a portion of the cap layer through the via opening to form a recess in the cap layer; filling the via opening and the recess with a reliability enhancement material; etching the reliability enhancement material from the via opening while maintaining the reliability enhancement material in the recess; and filling the via opening with a metal to form a metal-filled via in contact with the wiring line; wherein the reliability enhancement material surrounding the metal-filled via only in the cap layer to make a bottom of the metal-filled via that contacts the wiring line be under compressive stress, wherein the reliability enhancement material has different physical properties than the cap layer.

BRIEF DESCRIPTION OF SEVERAL VIEWS OF THE DRAWINGS

The features of the exemplary embodiments believed to be novel and the elements characteristic of the exemplary embodiments are set forth with particularity in the appended claims. The Figures are for illustration purposes only and are not drawn to scale. The exemplary embodiments, both as to organization and method of operation, may best be understood by reference to the detailed description which follows taken in conjunction with the accompanying drawings in which:

DETAILED DESCRIPTION

Figure 1A:
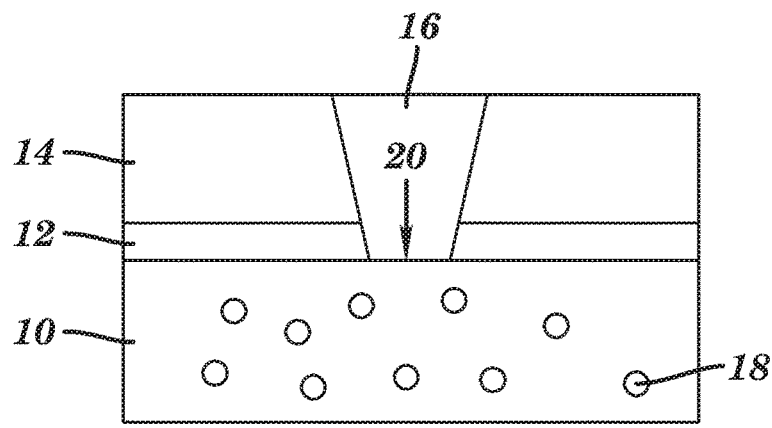
FIGS. 1A to 1C illustrate void formation under a via.
Figure 1B:
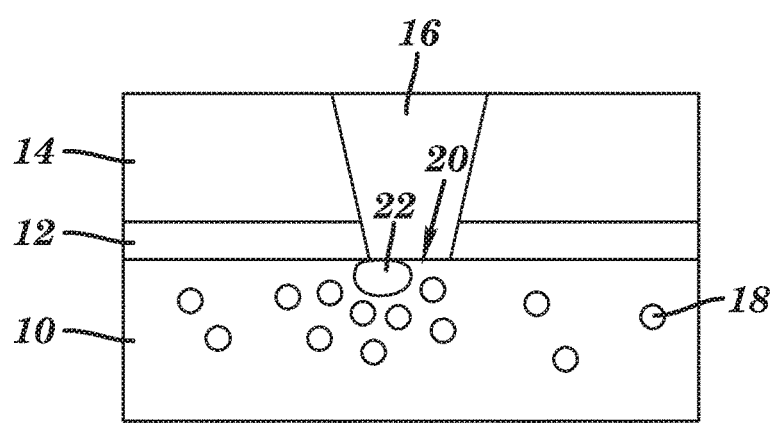
Figure 1C:
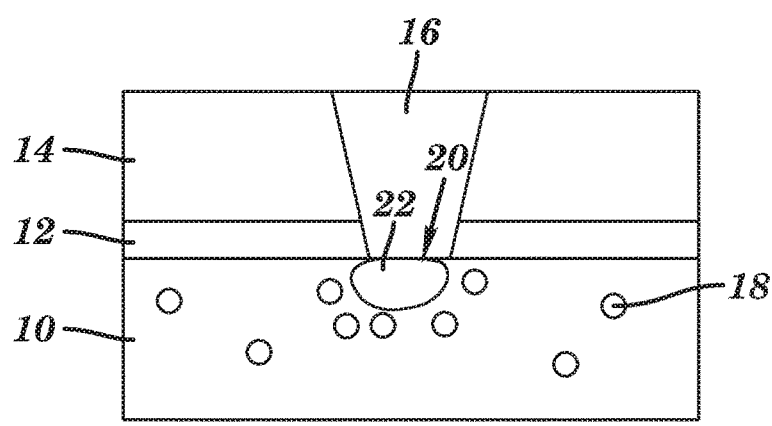

Referring to the Figures in more detail, and particularly referring to FIGS. 1A to 1C, there is shown an example of void formation under a via. FIG. 1A shows a wiring line 10 having a cap layer 12 and interlayer dielectric (ILD) layer 14. A bottom portion, as indicated by arrow 20, of a via 16 makes contact with the wiring line 10. The wiring line 10 may have vacancies 18. The bottom portion 20 of the via 16 may be under tensile stress.

Referring now to FIG. 1B, a void 22 has nucleated under the via bottom portion 20 due to the highest tensile stress there. Once the void 22 nucleates, a high stress gradient forms around the void 22.

Referring now to FIG. 1C, the vacancies 18 diffuse toward the nucleated void 22, driven by the stress gradient to make the void 22 grow larger underneath the via 16. Eventually, the void 22 can grow to become an open or at the very least reduce the contact between the bottom portion 20 of via 16 and wiring line 10. If via 16 is an iso-via, then all of the stress is concentrated at the one via instead of being spread among redundant vias. Moreover, if via 16 is an iso-via, failure of via 16 means that the circuit including wiring line 10 would also fail.

The present inventors have proposed through post design service and integration steps to strengthen the vias, to make them less susceptible to stress migration (SM) or stress voiding (SV) and electromigration (EM). More specifically, the present inventors have proposed changing the surroundings of the vias to make the metal at the via bottom portion and under the via bottom portion be under compressive stress, rather than under tensile stress. By making the via bottom portion and under the via bottom be under compressive stress:

a longer time is needed to reach the critical tensile stress for void formation under and at the via bottom portion;

it is also harder for metal void nucleation at the via bottom portion and/or under the via bottom portion, thereby mitigating the SM concerns; and the time for void formation incubation time for EM is extended, needing more metal atoms to migrate away from the via bottom portion or under the via bottom portion to cause the stress becoming sufficiently tensile for void nucleation.

In the following description, the "vias" referred to may be redundant vias (two or more vias per wiring line) or iso-vias (only one via per wiring line) but the teachings of the present exemplary embodiments are particularly relevant to semiconductor structures having iso-vias.

Figure 2:
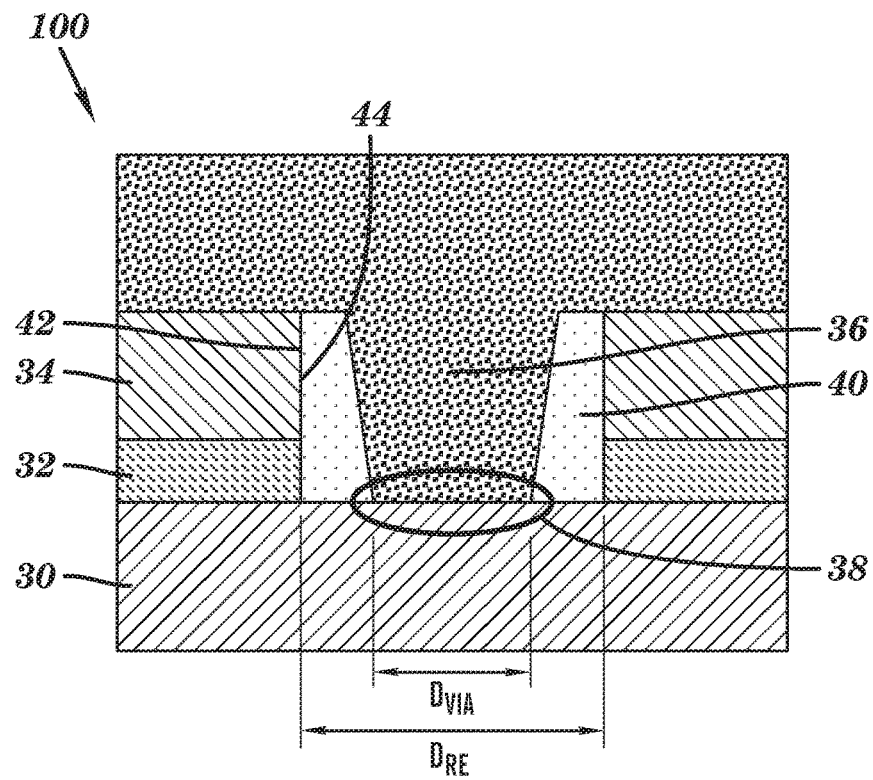
FIG. 2 is a cross sectional view of a first embodiment for providing reliability enhancement material around a via.

Referring now to FIG. 2, there is illustrated a first exemplary embodiment of a semiconductor structure 100 which includes a wiring line 30, cap layer 32, ILD layer 34 and via 36. The semiconductor structure 100 is a portion of the back end of the line wiring structure typically found on a semiconductor chip. In a back end of the line wiring structure, there will typically be a plurality of semiconductor structures similar to that shown in FIG. 2 that are stacked to form a multilayer back end of the fine wiring structure. Not shown are the semiconductor base and front end of the line portion which includes the various semiconductor devices such as transistors, capacitors and the like.

The wiring line 30 may comprise, for example, copper, the cap layer 32 may comprise, for example, silicon nitride or silicon carbide plus nitrogen (i.e., less nitrogen than silicon carbide nitride) and the ILD layer 34 may comprise, for example, an oxide or a low K dielectric constant material such as SiCOH. The cap layer 32 may be optional but it is usually present in semiconductor structure 100. The semiconductor structure 100 further includes a via 36 which may include copper. The walls of the via 36 may have a barrier layer (not shown) such as tantalum/tantalum nitride. In the prior art, the area 38 where the via 36 makes contact with the wiring line 30 may be under tensile stress which may lead to the SM and EM problems noted above.

Accordingly, the present inventors have proposed a "reliability enhancement" material 40 to be placed around the via 36 for at least part of the height of via 36. As shown in FIG. 2, the reliability enhancement (hereafter "RE") material surrounds the entire via 36 along its entire height through the cap layer 32 and ILD layer 34 and exerts a compressive stress on the via 36 at area 38 so as to ameliorate the SM, SV and EM problems of the prior art.

The RE material 40 may be, for example, a silicon nitride ($Si_xN_y$), silicon carbide (SiC) or a silicon carbide nitride ($Si_xC_yN_z$) and it may be deposited to be compressive or may be made compressive after deposition. If the via 36 has a barrier layer, the barrier layer is between the RE material 40 and the metal (usually copper) filling the via 36.

Deposition process and treatment conditions may be tailored to deposit a compressive stressed material on the substrate or to treat a material during or after deposition to increase its compressive stress value. For example, a silicon nitride stressed material having higher compressive stress values may be obtained by increasing the RF bombardment to achieve higher film density by having more Si—N bonds in the deposited material and reducing the density of Si—H and N—H bonds. Higher deposition temperatures and RF power may also improve the compressive stress levels of the deposited film.

It should be understood that while the cap layer 32 and RE material 40 may comprise the same material, RE material 40 is deposited to be compressive or is made compressive after deposition. In addition, RE material 40 may be a material that is separate from cap layer 32.

The opening 42 through the cap layer 32 and the ILD layer 34 may be enlarged to accommodate the RE material 40. The RE material 40 is sized to exert a sufficient force on the via 36 to render the area 38 compressive. For example, for a via having a dimension $D_{via}$ where the via 36 contacts the wiring line 30, the opening 42 should have a dimension of $D_{RE}$ where $D_{RE}$ should be at least 2 nanometers greater than $D_{VIA}$ so that the wall thickness of the RE material 40 is greater than 1 nanometer thick.

Figure 3:
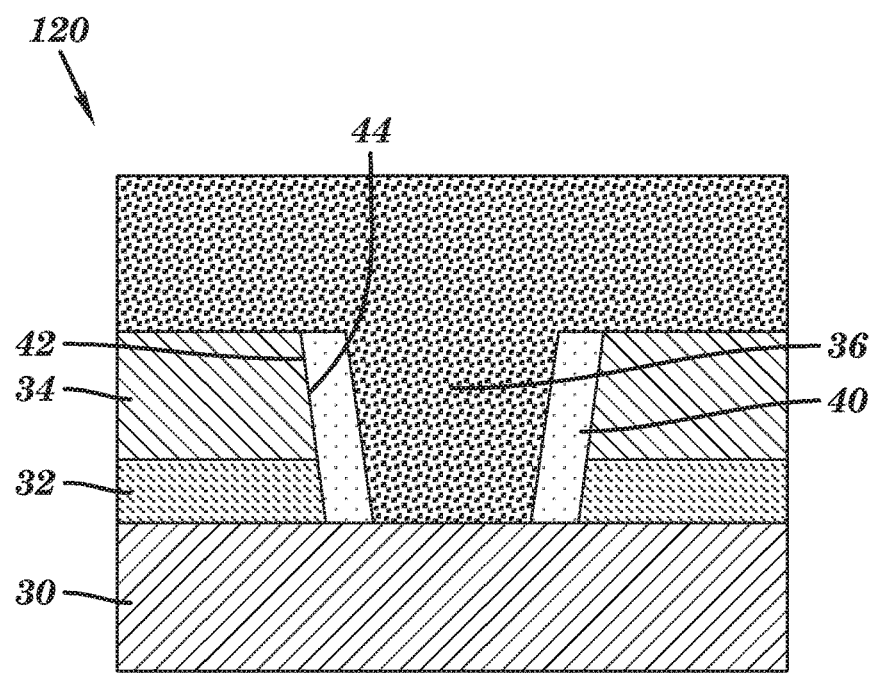
FIG. 3 is a cross sectional view of a second embodiment for providing reliability enhancement material around a via.

It is noted that the outer wall 44 of the RE material 40 is vertical in FIG. 2. Referring now to FIG. 3, the embodiment 120 in FIG. 3 is identical to the embodiment in FIG. 2 except that the wall 44 of the RE material 40 is not vertical and may be inclined at any angle to match the inclined angle of the walls of the via 36. In all other respects, the embodiment 120 is similar to embodiment 100 in FIG. 2.

Figure 4:
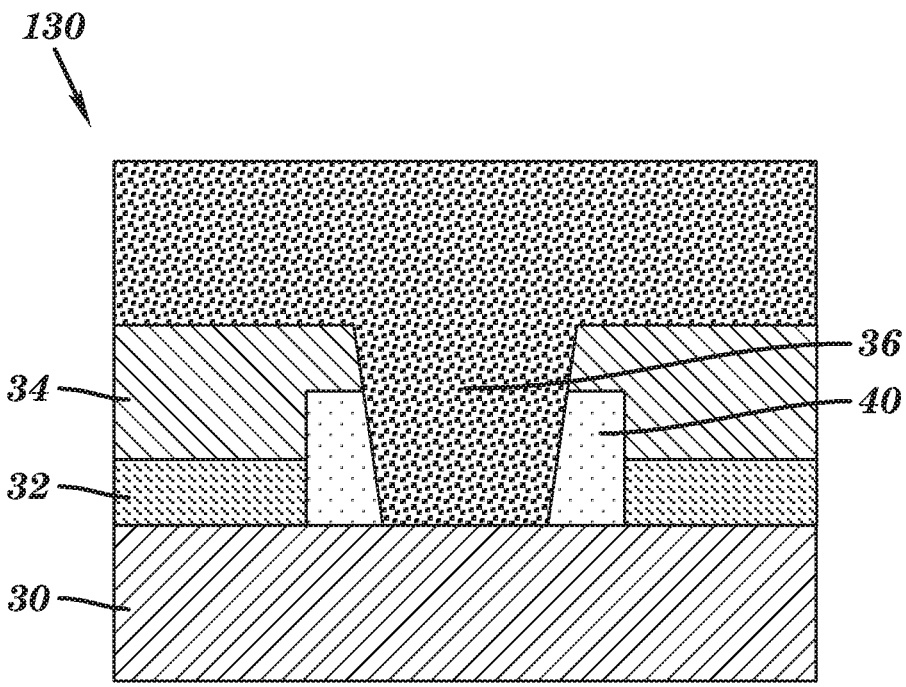
FIG. 4 is a cross sectional view of a third embodiment for providing reliability enhancement material around a via.

A further embodiment 130 of the invention is illustrated in FIG. 4. Whereas in FIGS. 2 and 3 the RE material 40 surrounded the via 36 and extended the full height of the cap layer 32 and the ILD layer 34, in FIG. 4 the RE material 40 surrounds the via 36 and extends the full height of the cap layer 32 and only part way up the height of the ILD layer 32. In all other respects, the embodiment 130 is similar to embodiment 100 in FIG. 2.

Figure 5:
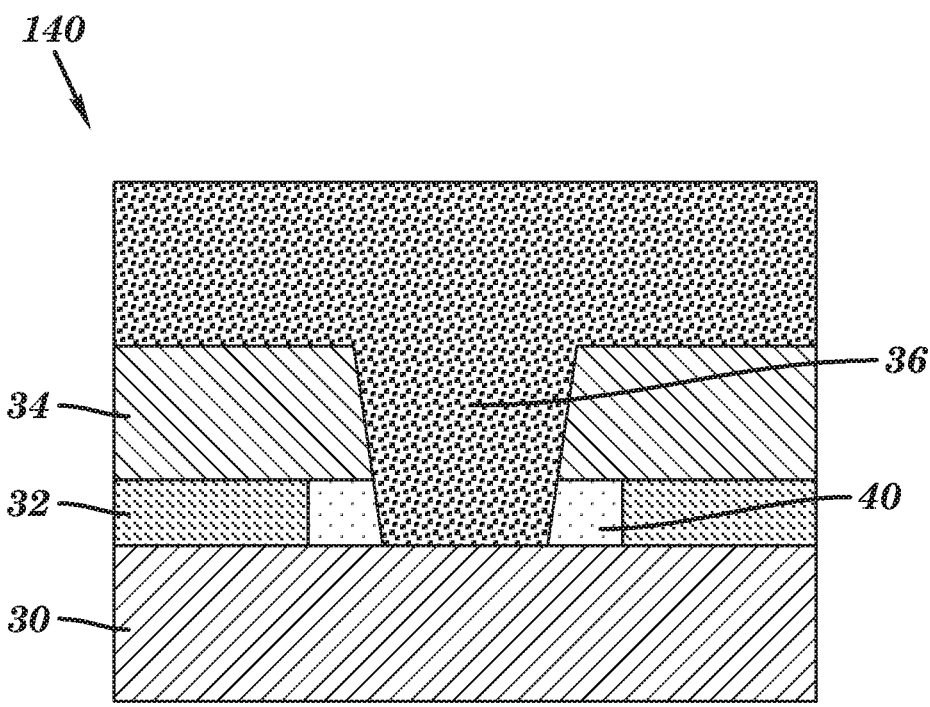
FIG. 5 is a cross sectional view of a fourth embodiment for providing reliability enhancement material around a via.

Another embodiment 140 is illustrated in FIG. 5 where the RE material 40 surrounds the via 36 and extends only the full height of the cap layer 32. It is to be understood that the RE material 40, even though only in the cap layer 32, is distinguishable from the cap layer 32 because either the RE material 40 may be different from the material of the cap layer 32 or the RE material 40 may be compressive whereas the material of the cap layer 32 may not be compressive. In all other respects, the embodiment 140 is similar to embodiment 100 in FIG. 2.

Figure 6:
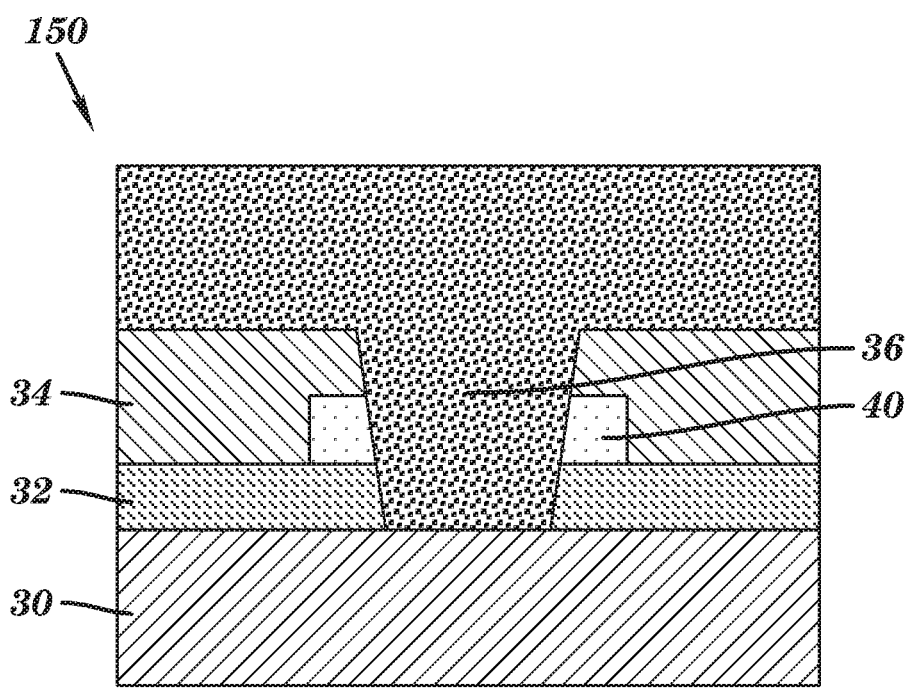
FIG. 6 is a cross sectional view of a fifth embodiment for providing reliability enhancement material around a via.

Yet another embodiment 150 is illustrated in FIG. 6 in which the RE material 40 is only in a portion of the ILD layer 34. In all other respects, the embodiment 150 is similar to embodiment 100 in FIG. 2.

Figure 7:
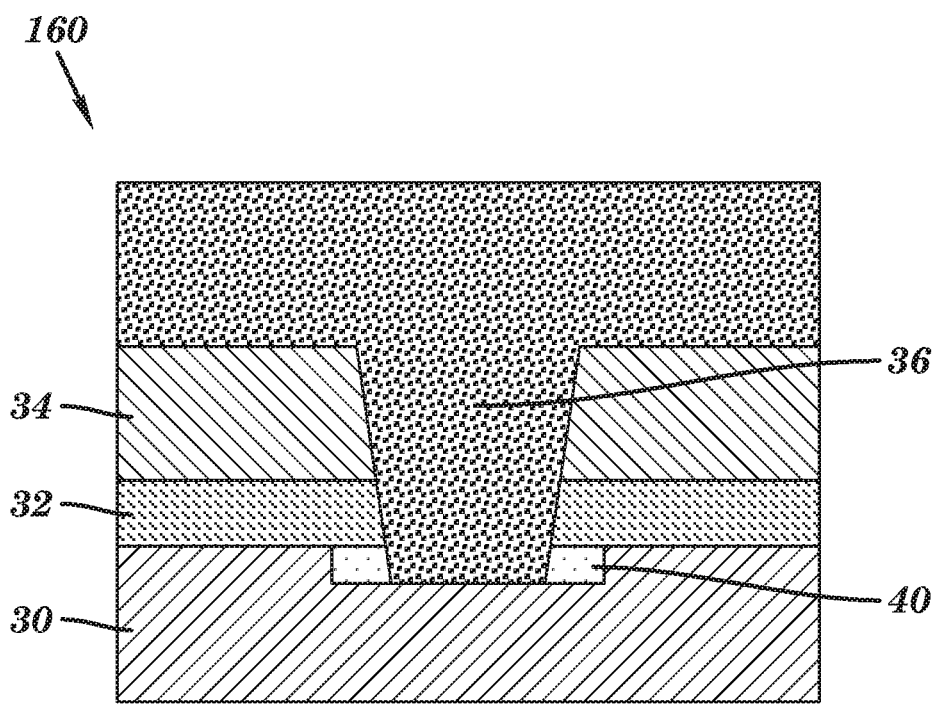
FIG. 7 is a cross sectional view of a sixth embodiment for providing reliability enhancement material around a via.

A next embodiment 160 is illustrated in FIG. 7 in which the RE material 40 is in neither the cap layer 32 nor the ILD layer 34. Rather, the RE material 40 is in the wiring line 30 and surrounds the via 36 where the via 36 makes direct contact with the wiring line 30. In all other respects, the embodiment 160 is similar to embodiment 100 in FIG. 2.

Figure 8A:
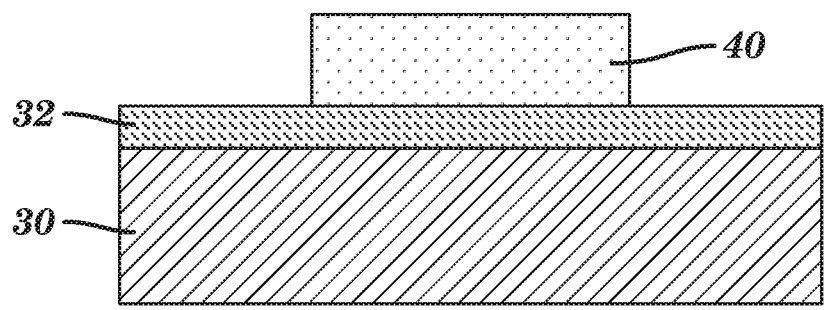
FIGS. 8A to 8D illustrate a method for making the fifth embodiment of FIG. 6.
Figure 8B:
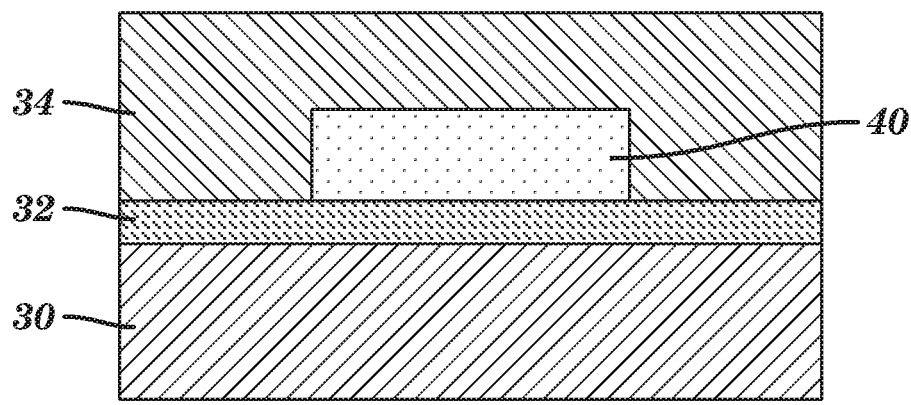
Figure 8C:
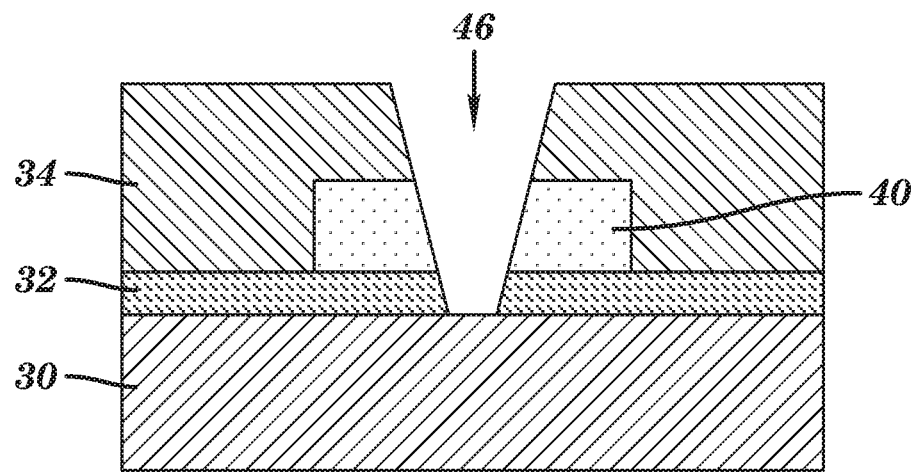
Figure 8D:
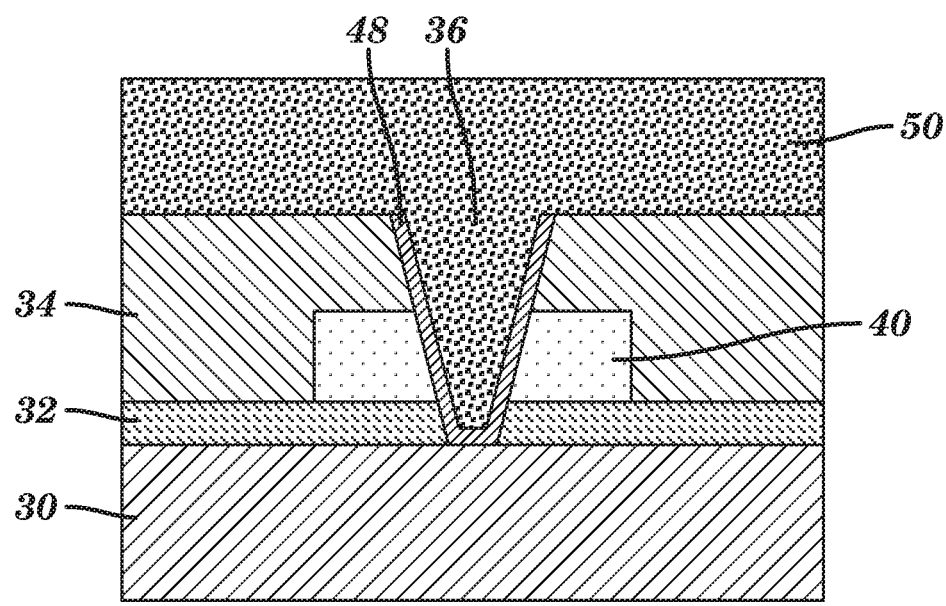

Referring now to FIGS. 8A to 8D, there is disclosed a process for manufacturing the embodiment 150 disclosed in FIG. 6. In a first process illustrated in FIG. 8A, wiring line 30 and cap layer 32 are patterned. Then, a layer of RE material is deposited and patterned to result in RE material 40 on cap layer 32. In a next process as illustrated in FIG. 8B, an ILD layer 34 is deposited on the cap layer 32 and RE material 40. Next, as illustrated in FIG. 8C, a via opening 46 is formed through ILD layer 34, RE material 40 and cap layer 32 by a process such as reactive ion etching. The wiring line 30 is exposed through the via opening 46. In subsequent process steps illustrated in FIG. 8D, a barrier layer 48 may be deposited in the via opening 46 followed by deposition of a metal 50, typically copper, to form via 36.

According to this aspect of the exemplary embodiments disclosed in FIGS. 8A to 8D, there is provided a process of making a semiconductor structure which includes: forming a wiring line; forming a cap layer on the wiring line; forming a reliability enhancement material on the cap layer; forming an interlayer dielectric (ILD) layer on the cap layer and on the reliability enhancement material; forming a via opening through the ILD layer, reliability enhancement material and cap layer to expose a surface of the wiring line; and filling the via opening with a metal to form a metal-filled via in contact with the wiring line; wherein the reliability enhancement material causes a compressive stress on the metal-filled via where it contacts the wiring line.

Figure 9A:
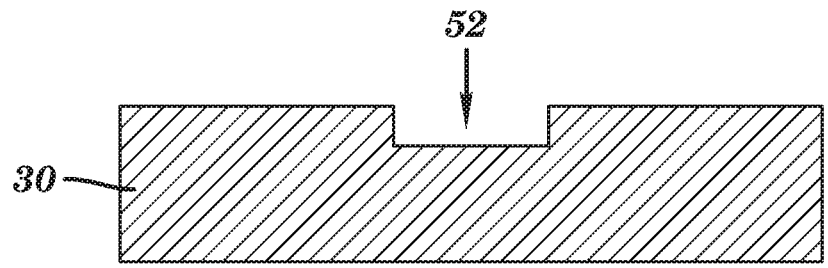
FIGS. 9A to 9E illustrate a method for making the sixth embodiment of FIG. 7.
Figure 9B:
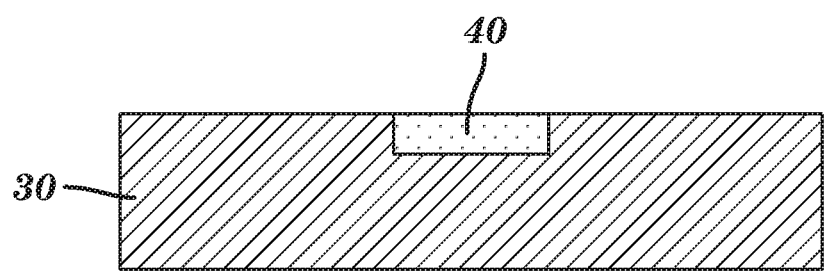
Figure 9C:
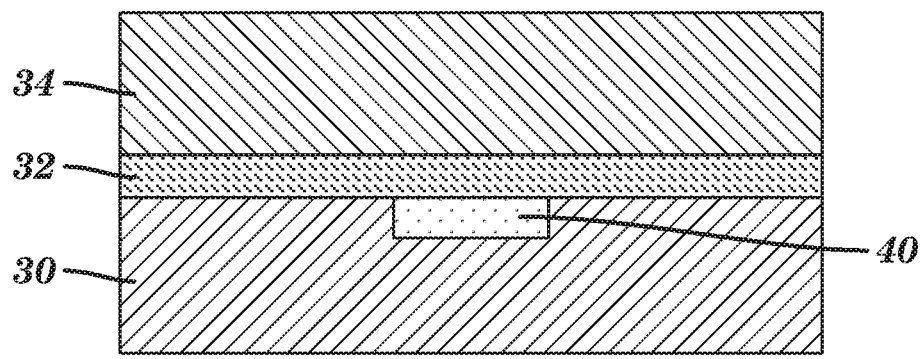
Figure 9D:
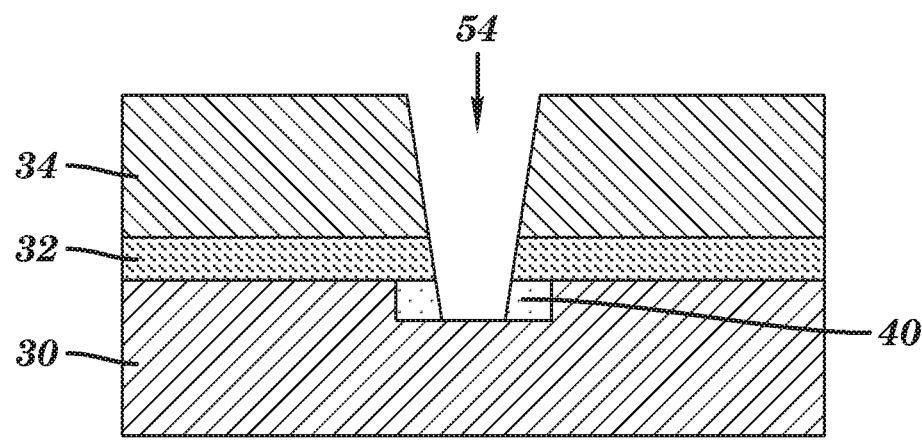
Figure 9E:
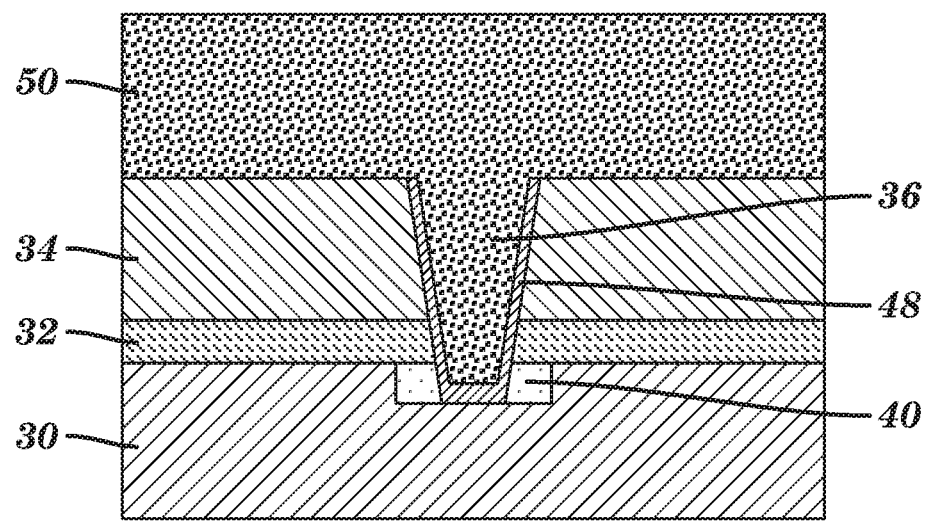

Referring now to FIGS. 9A to 9E, there is disclosed a process for manufacturing the embodiment 160 in FIG. 7. In a first process illustrated in FIG. 9A, the wiring line 30 may be recessed to form a recess 52 such as by wet etching of wiring line 30. Thereafter, in a next process as illustrated in FIG. 9B, RE material 40 may be deposited to fill the recess 52. Any overburden may be removed by a process such as chemical-mechanical polishing. Thereafter, cap layer 32 and ILD layer 34 may be deposited and patterned as illustrated in FIG. 9C. In FIG. 9D, a via opening 54 is formed through ILD layer 34, cap layer 32 and RE material 40 by a process such as reactive ion etching. The wiring line 30 is exposed through the via opening 54. In subsequent process steps illustrated in FIG. 9E, a barrier layer 48 may be deposited in the via opening 54 followed by deposition of a metal 50, typically copper, to form via 36.

According to this aspect of the exemplary embodiments disclosed in FIGS. 9A to 9E, there is provided a process of making a semiconductor structure which includes: forming a wiring line; forming a recess in the wiring line; filling the recess with a reliability enhancement material; forming a cap layer over the wiring line and the recess; forming an interlayer dielectric (ILD) layer on the cap layer; forming a via opening through the ILD layer, cap layer and reliability enhancement material to expose a surface of the wiring line; and filling the via opening with a metal to form a metal-filled via in contact with the wiring line; wherein the reliability enhancement material causes a compressive stress on the metal-filled via where it contacts the wiring line.

Figure 10A:
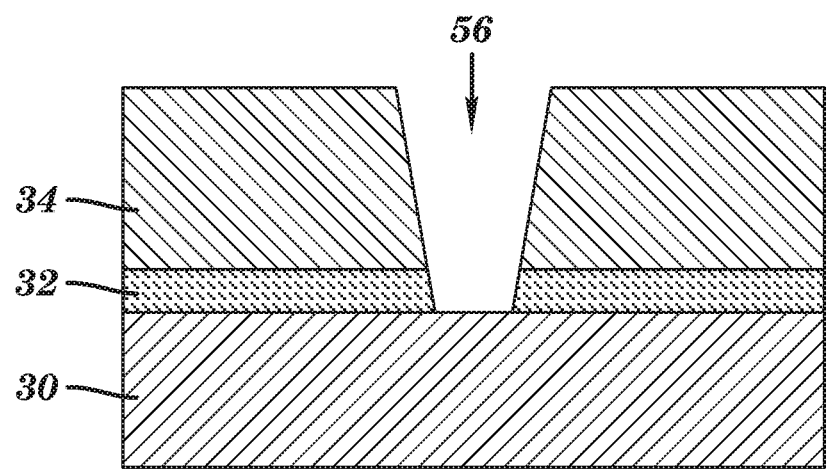
FIGS. 10A to 10E illustrate a first method for making the fourth embodiment of FIG. 5.
Figure 10B:
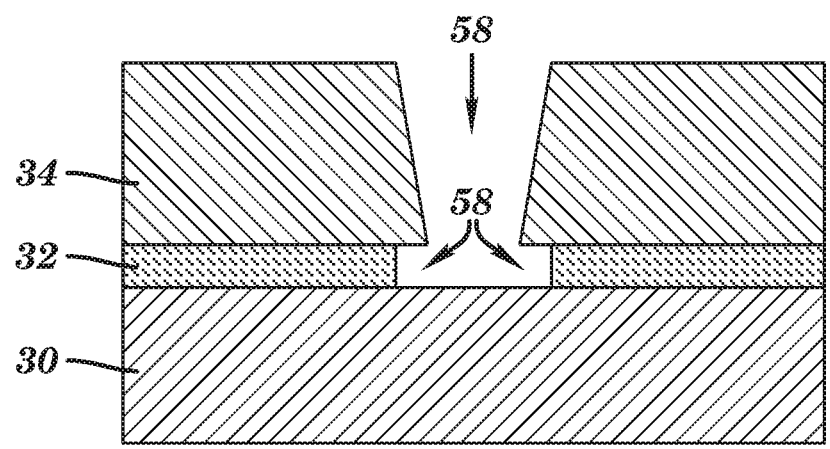
Figure 10C:
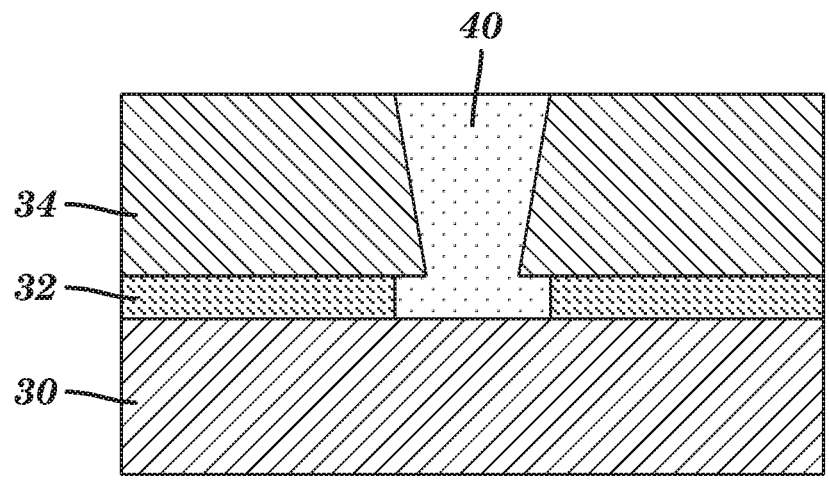
Figure 10D:
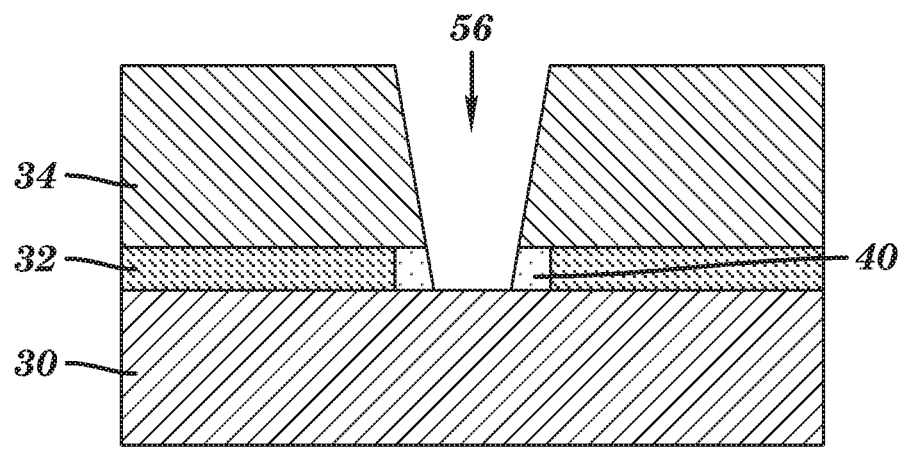

Referring now to FIGS. 10A to 10E, there is disclosed a first process for manufacturing the embodiment 140 in FIG. 5. In a first process illustrated in FIG. 10A, wiring line 30, cap layer 32 and ILD layer 34 are deposited and patterned. Thereafter, a via opening 56 is formed through ILD layer 34 and cap layer 32 by a process such as reactive ion etching. The wiring line 30 is exposed through the via opening 56. In a next process illustrated in FIG. 10 ft portions of the cap layer 32 are removed by a lateral etch such as an isotropic RIE etch to form recesses 58. Thereafter, via opening 56 and recesses 58 are filled with RE material 40 as shown in FIG. 10C. By an anisotropic RIE etch , the RE material 40 is removed except in recesses 58 as shown in FIG. 10D. In subsequent process steps illustrated in FIG. 10E, a barrier layer 48 may be deposited in the via opening 54 followed by deposition of a metal 50, typically copper, to form via 36.

According to this aspect of the exemplary embodiments disclosed in FIGS. 10A to 10E, there is provided a process of making a semiconductor structure which includes: forming a wiring line; forming a cap layer on the wiring line; forming an interlayer dielectric (ILD) layer on the cap layer; forming a via opening through the ILD layer and cap layer to expose a surface of the wiring line; etching a portion of the cap layer through the via opening to form a recess in the cap layer; filling the via opening and the recess with a reliability enhancement material; etching the reliability enhancement material from the via opening while maintaining the reliability enhancement material in the recess; and filling the via opening with a metal to form a metal-filled via in contact the wiring line; wherein the reliability enhancement material causes a compressive stress on the metal-filled via where it contacts the wiring line.

Figure 11A:
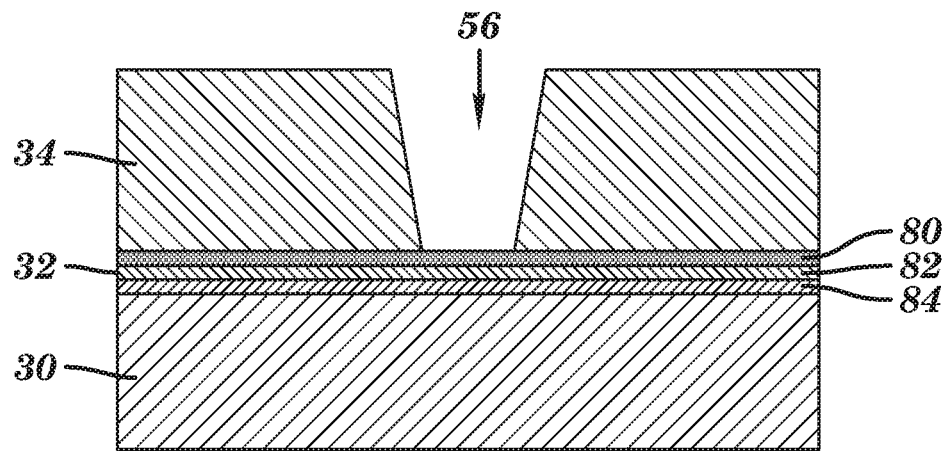
FIGS. 11A and 11B illustrate a second method for making the fourth embodiment of FIG. 5.
Figure 11B:
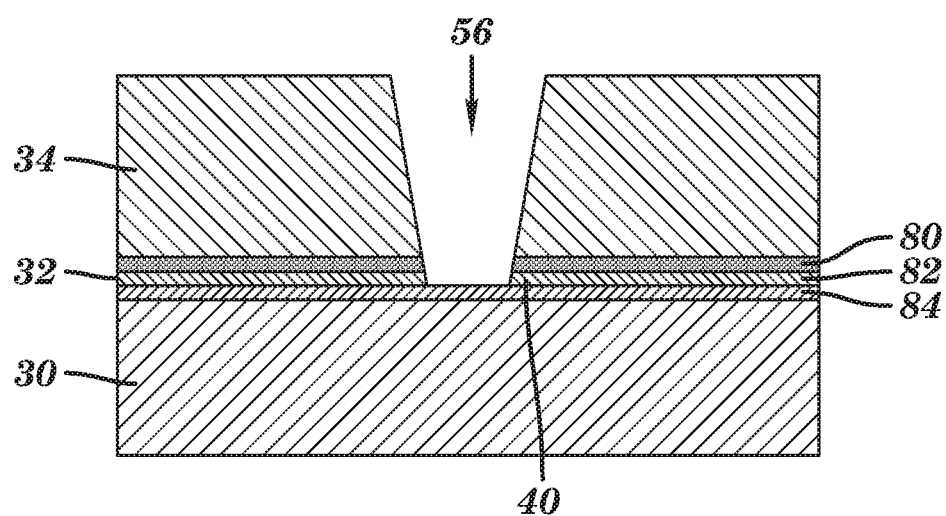

Referring now to FIGS. 11A and 11B, there is disclosed a second process for manufacturing the embodiment 140 in FIG. 5. In a first process illustrated in FIG. 11A, wiring line 30, cap layer 32 and ILD layer 34 are deposited and patterned. In this case, cap layer 32 is a multiple layered film comprising a first layer 80 of $Si_xC_yN_z$, a silicon-rich $Si_xC_yN_z$ layer 82 and a third layer 84 of $Si_xC_yN_z$. The silicon-rich $Si_xC_yN_z$ layer 82 may be deposited so as to be higher in silicon content than the first and third layers of $Si_xC_yN_z$. The silicon-rich $Si_xC_yN_z$ should be at least 5 atomic percent richer in silicon than the first and third layers of $Si_xC_yN_z$.

Figure 10E:
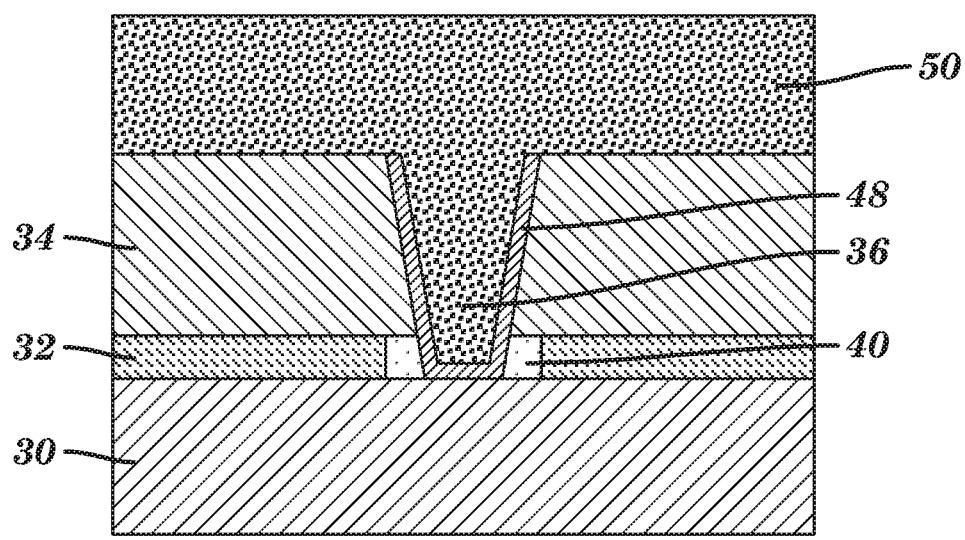

Thereafter a via opening 56 is formed through ILD layer 34 and partially through cap layer 32 by a process such as reactive ion etching. Regarding the cap layer 32, the via opening 56 only extends through the first layer 80 of $Si_xC_yN_z$ and the silicon-rich $Si_xC_yN_z$ layer 82 and stops on the third layer 84 of $Si_xC_yN_z$. That is, the third layer 84 of $Si_xC_yN_z$ remains on the wiring line 30. The wiring line 30 with the third layer 84 of $Si_xC_yN_z$ is exposed through the via opening 56. The structure shown in FIG. 11A is then exposed to a high pressure oxidation such as by annealing in a high pressure furnace which contains oxygen to oxidize a portion of the silicon-rich $Si_xC_yN_z$ layer 82 to form SiOCN which swells and puts the portion of the silicon-rich $Si_xC_yN_z$ layer 82 in compression to form RE material 40 as illustrated in FIG. 11B. In subsequent process steps as illustrated in FIG. 10E, a barrier layer 48 may be deposited in the via opening 54 followed by deposition of a metal 50, typically copper, to form via 36.

According to this aspect of the exemplary embodiments disclosed in FIGS. 11A and 11B, there is provided a process of making a semiconductor structure which includes: forming a wiring line; forming a cap layer on the wiring line, the cap layer being a multiple layer structure with first, second and third layers of the multiple layer structure comprising silicon, carbon and nitrogen with the second layer having a higher silicon content than the first and third layers; forming an interlayer dielectric (ILD) layer on the cap layer; forming a via opening through the ILD layer and the first and second layers of the cap layer to expose the third layer of the cap layer on a surface of the wiring line; oxidizing the cap layer so that the second layer comprises Si, oxygen, carbon and nitrogen and expands with respect to the first and third layers such that the expanded second layer becomes a reliability enhancement material; and filling the via opening with a metal to form a metal-filled via in contact with the wiring line; wherein the reliability enhancement material causes a compressive stress on the metal-filled via where it contacts the wiring line.

Figure 12:
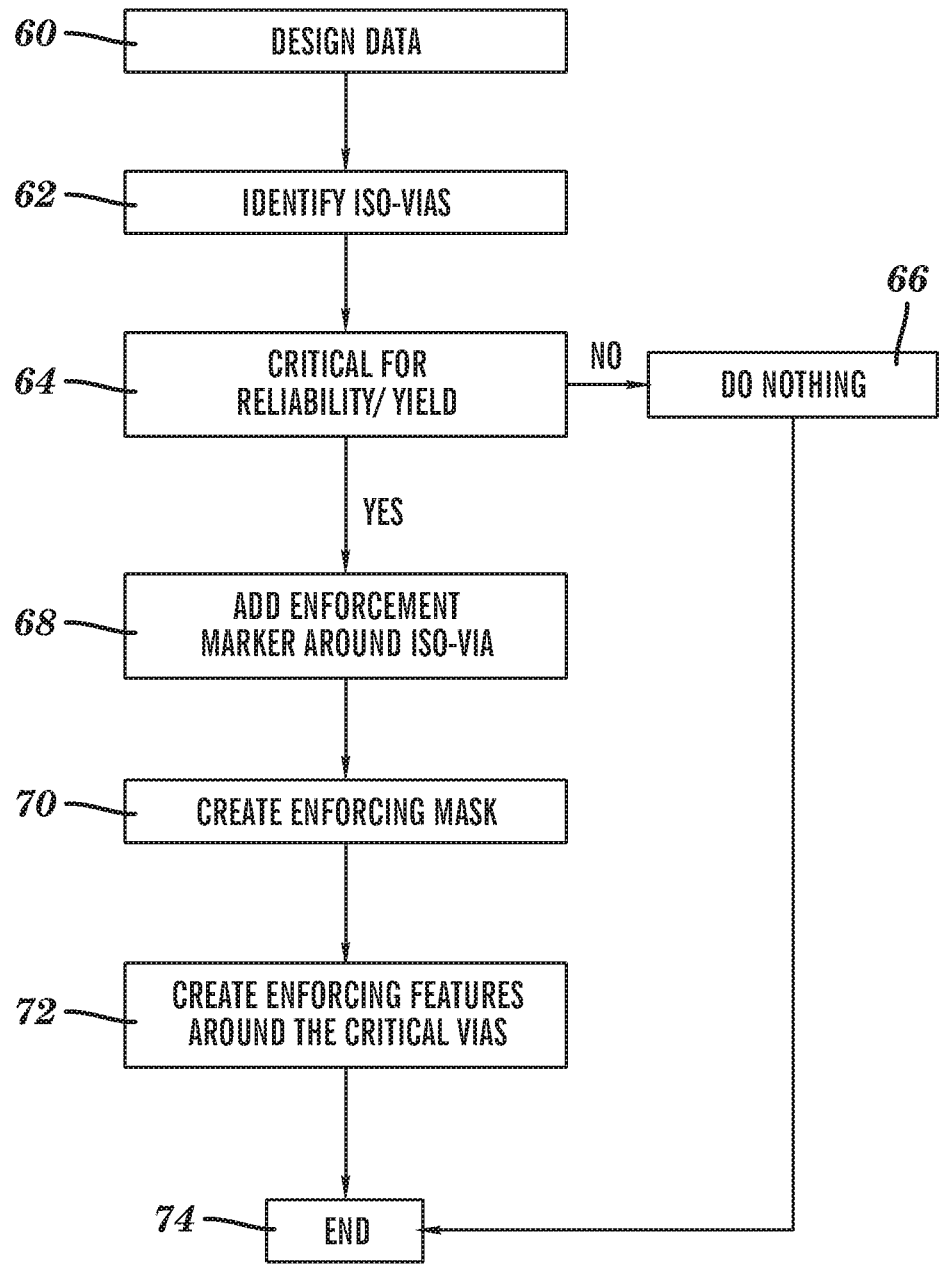
FIG. 12 illustrate a design process for enhancement of iso-vias in a semiconductor chip design.

Referring now to FIG. 12, there is disclosed a design process for enhancement of iso-via reliability in a semiconductor chip design. In a first process, design data is received as indicated in box 60. From the design data, iso-vias are identified, box 62. A determination is then made whether or not enhancement of the iso-via is critical for reliability or yield improvement, box 64. The determination may be made based on previous experience or reliability results on similar configurations. If enhancement of the iso-via is not critical, the process branches off to "Do Nothing", box 66, and the process ends, box 74. If enhancement of the iso-via is critical, a marker is added to the via in the semiconductor chip design to indicate that enhancement is required, box 68. The presence of the marker is noted and appropriate semiconductor processing masks (for example, lithography, etching, etc.) are created, box 70, for incorporating RE material into the semiconductor chip design. The process then proceeds to create the enforcing features around the iso-vias, box 72, by incorporating RE material into the semiconductor chip as it is being manufactured. Any of the reliability enhancement material embodiments previously discussed may be used to enforce the iso-vias. Thereafter, the process ends, box 74.

The design process may be implemented on one or computing devices.

According to this aspect of the exemplary embodiments disclosed in FIG. 12, there is provided a design process for enhancement of iso-via reliability which includes: receiving design data for a semiconductor chip design having a plurality of iso-vias; identifying the iso-vias in the semiconductor chip design; determining whether enhancement of the iso-via by incorporating reliability enhancement material around the iso-via in the semiconductor chip design is critical for reliability or yield improvement; responsive to determining that enhancement of the iso-via is critical, adding a marker to the iso-via in the semiconductor chip design to indicate that enhancement of the iso-via is required; and creating appropriate semiconductor processing masks to provide for the enhancement of the iso-via by incorporating reliability enhancement material around the iso-via in the semiconductor chip design; wherein the process is performed on one or more computing devices.

Figure 13:
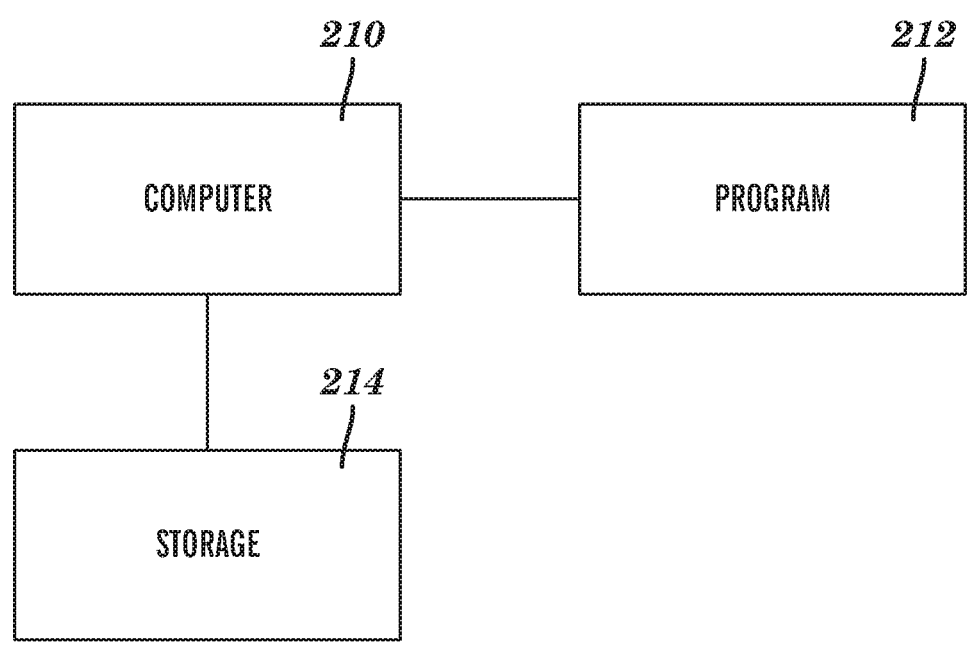
FIG. 13 is a block diagram that illustrates an exemplary hardware environment of the computing devices for implementing the design process in FIG. 12.

The computing devices implementing the design process may be a general-purpose computer or a special purpose computing device such as a hand-held computer. FIG. 13 is a block diagram that illustrates one exemplary hardware environment of the computing devices. The exemplary embodiments may be implemented using a computer 210 comprised of microprocessor means, random access memory (RAM), read-only memory (ROM) and other components. The computer 210 may be a personal computer, server, mainframe computer, hand-held device or other computing device. Resident in the computer 210, or peripheral to it, may be a storage device 214 of some type such as a hard disk drive, floppy disk drive, CD-ROM drive, tape drive or other storage device.

Generally speaking, the software implementation of the exemplary embodiments, program 212 in FIG. 13, may be tangibly embodied in a computer-readable medium such as one of the storage devices 214 mentioned above. The program 212 may comprise instructions which, when read and executed by the microprocessor of the computer 210, may cause the computer 210 to perform the steps necessary to execute the steps or elements of the exemplary embodiments.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It will be apparent to those skilled in the art having regard to this disclosure that other modifications of the exemplary embodiments beyond those embodiments specifically described here may be made without departing from the spirit of the invention. Accordingly, such modifications are considered within the scope of the invention as limited solely by the appended claims.

What is claimed is:

1. A semiconductor structure comprising:
   a semiconductor base comprising a plurality of semiconductor devices;
   a back end of the line wiring layer comprising:
      a wiring line;
      a cap layer on the wiring line;
      a reliability enhancement material within the cap layer and on the wiring line;
      an interlayer dielectric (ILD) layer on the cap layer and the reliability enhancement material;
      a via extending through the ILD and the reliability enhancement material to communicate with the wiring line; and
      a metal filling the via and in contact with the wiring line;
      wherein the reliability enhancement material surrounds the metal-filled via only in the cap layer to make a bottom of the metal-filled via that contacts the wiring line be under compressive stress, wherein the reliability enhancement material has different physical properties than the cap layer.

2. The semiconductor structure of claim 1 wherein the different physical properties includes the reliability enhancement material has a different material composition than the cap layer.

3. The semiconductor structure of claim 1 wherein the different physical properties includes the reliability enhancement material is compressive and the cap layer is not compressive.

4. The semiconductor structure of claim 1 wherein the via has a via wall and further comprising a barrier layer on the via wall between the via wall and the metal filling the via.

5. The semiconductor structure of claim 1 wherein the reliability enhancement material is selected from the group of materials consisting of silicon nitride, silicon carbide and silicon carbide nitride.

6. The semiconductor structure of claim 1 wherein the cap layer is selected from the group consisting of silicon nitride and silicon carbide plus nitrogen.

7. The semiconductor structure of claim 1 wherein the reliability enhancement material is separate from the cap layer.

8. A process of making a semiconductor structure comprising:
   forming a wiring line;
   forming a cap layer on the wiring line;
   forming a reliability enhancement material within the cap layer and on the wiring line;
   forming an interlayer dielectric (ILD) layer on the cap layer;
   forming a via opening through the ILD layer and reliability enhancement material to expose a surface of the wiring line; and
   filling the via opening with a metal to form a metal-filled via in contact with the wiring line;
   wherein the reliability enhancement material surrounding the metal-filled via only in the cap layer to make a bottom of the metal-filled via that contacts the wiring line be under compressive stress, wherein the reliability enhancement material has different physical properties than the cap layer.

9. The process of claim 8 wherein the different physical properties includes the reliability enhancement material has a different material composition than the cap layer.

10. The process of claim 8 wherein the different physical properties includes the reliability enhancement material is compressive and the cap layer is not compressive.

11. The process of claim 8 wherein the reliability enhancement material is deposited so as to be compressive.

12. The process of claim 8 further comprising after forming a reliability enhancement material, treating the reliability enhancement material so as to be compressive.

13. The process of claim 8 wherein the via has a via wall and further comprising a barrier layer on the via wall between the via wall and the metal filling the via.

14. The process of claim 8 wherein the reliability enhancement material is selected from the group of materials consisting of silicon nitride, silicon carbide and silicon carbide nitride.

15. The process of claim 8 wherein the cap layer is selected from the group consisting of silicon nitride and silicon carbide plus nitrogen.

16. A process of making a semiconductor structure comprising:
    forming a wiring line;
    forming a cap layer on the wiring line;
    forming an interlayer dielectric (ILD) layer on the cap layer;
    forming a via opening through the ILD layer to expose a surface of the wiring line;
    etching a portion of the cap layer through the via opening to form a recess in the cap layer;
    filling the via opening and the recess with a reliability enhancement material;
    etching the reliability enhancement material from the via opening while maintaining the reliability enhancement material in the recess; and
    filling the via opening with a metal to form a metal-filled via in contact with the wiring line;
    wherein the reliability enhancement material surrounding the metal-filled via only in the cap layer to make a bottom of the metal-filled via that contacts the wiring line be under compressive stress, wherein the reliability enhancement material has different physical properties than the cap layer.

17. The process of claim 16 wherein the different physical properties includes the reliability enhancement material has a different material composition than the cap layer.

18. The process of claim 16 wherein the different physical properties includes the reliability enhancement material is compressive and the cap layer is not compressive.

19. The process of claim 16 wherein the reliability enhancement material is deposited so as to be compressive.

20. The process of claim 16 further comprising after forming a reliability enhancement material, treating the reliability enhancement material so as to be compressive.

* * * * *